United States Patent
Cox et al.

[19]

[11] Patent Number: 5,851,927
[45] Date of Patent: Dec. 22, 1998

[54] METHOD OF FORMING A SEMICONDUCTOR DEVICE BY DUV RESIST PATTERNING

[75] Inventors: Paul Kevin Cox, Austin, Tex.; Thy Ngu-Uyen Tran, Vancouver, Wash.; Samuel Jay Wright, Austin; Judith Sobresky, Dripping Springs, both of Tex.

[73] Assignee: Motorola, Inc., Schaumburg, Ill.

[21] Appl. No.: 920,656

[22] Filed: Aug. 29, 1997

[51] Int. Cl.$^6$ .......... H01L 21/285; H01L 21/311; H01L 21/336; H01L 21/8244

[52] U.S. Cl. .......... 438/744; 438/593; 438/725; 438/761; 427/407.1

[58] Field of Search .......... 430/191, 192, 430/165, 270.1, 271.1, 323, 326; 438/593, 725, 744, 761

[56] References Cited

U.S. PATENT DOCUMENTS

| | | | |
|---|---|---|---|
| 5,378,659 | 1/1995 | Roman et al. | 438/761 |
| 5,401,613 | 3/1995 | Brewer et al. | 430/323 |
| 5,407,866 | 4/1995 | Sellers | 438/622 |
| 5,413,952 | 5/1995 | Pages et al. | 438/406 |
| 5,422,223 | 6/1995 | Sachdev et al. | 430/190 |
| 5,441,914 | 8/1995 | Taft et al. | 438/592 |
| 5,565,304 | 10/1996 | Honda | 430/311 |
| 5,633,111 | 5/1997 | Yoshimoto et al. | 430/165 |
| 5,674,657 | 10/1997 | Tan et al. | 430/191 |
| 5,702,767 | 12/1997 | Peterson et al. | 427/407.1 |

OTHER PUBLICATIONS

Wolf, S. and Tauber, R.N., "Silicon Processing for the VLSI Era", vol. 1 — Process Technology (Sunset Beach CA: Lattice Press), 1986.

Wolf, Stanley, "Silicon Processing for the VLSI Era", vol. 2 — Process Integration (Sunset Beach CA: Lattice Press), 1990.

*Primary Examiner*—Robert Kunemund
*Assistant Examiner*—Donald L. Champagne
*Attorney, Agent, or Firm*—Jeffrey S. Abel

[57] ABSTRACT

A method for forming a semiconductor device, including providing a silicon substrate (10), forming a gate stack (11) on the substrate (10), coating a deep ultra-violet (DUV) photoresist (30) on the gate stack (11), exposing and developing the photoresist (30), and etching the gate stack (11). According to the present invention, the gate stack (11) has a dielectric nitride layer (26), particularly, a silicon nitride layer. An adhesive oxide layer (28) is provided between the nitride layer (26) and the photoresist (30) to prevent undesirable lifting of the photoresist (30). Yield is greatly increased and defectivity is reduced.

23 Claims, 7 Drawing Sheets

METHOD OF FORMING A SEMICONDUCTOR DEVICE BY DUV RESIST PATTERNING

BACKGROUND OF THE INVENTION

The present invention is drawn to a novel process for forming a semiconductor device, particularly, a gate stack of a semiconductor device having very small geometry. With increasing demand for miniaturized semiconductor devices, new processing problems are frequently encountered. For example, to miniaturize further semiconductor devices, DUV (deep-ultraviolet, 248 nm) lithography has been utilized in the industry. DUV lithography permits further shrinking of semiconductor devices, for example, from 0.45 micron to 0.35 micron and smaller semiconductor devices such as SRAMs.

Referring to FIGS. 1 and 2, a process for forming a semiconductor device (on the order of 0.4 micron) is shown. More particularly, FIGS. 1 and 2 illustrate a gate stack 11 of a transistor that is a component of an SRAM cell. First, a gate oxide layer 12 is formed on a silicon substrate 10. The gate oxide layer 12 is generally formed by thermal oxidation of the silicon substrate 10, and has a thickness on the order of 50 to 90 angstroms. Then, gate electrode 21 is formed on gate oxide layer 12, gate electrode 21 including (i) two poly (polycrystalline silicon) layers 14, and (ii) a metal-containing layer, particularly a tungsten silicide ($WS_{ix}$) layer 20. Each poly layer 14 has a thickness of about 550 angstroms, and is formed by utilizing low-pressure chemical vapor deposition (LPCVD) at forming temperatures on the order of 540 to 550 degrees Celsius. It is noted that while the poly layers 14 are amorphous at deposition, they are crystallized to polycrystalline form by later heat treatment. The tungsten silicide is also formed by LPCVD, in a single wafer process, and has a thickness of about 600 angstroms. The tungsten silicide layer 20 is provided to lower the total resistance of gate electrode 21. While the gate electrode 21 incorporates two poly layers and a metal-containing layer (tungsten silicide), other gate electrode structures may be utilized. For example, the tungsten silicide layer may be replaced with titanium silicide, or the tungsten silicide may be eliminated entirely.

Described in more detail below, the gate stack is subjected to DUV energy. In this regard, the poly layers 14 and tungsten silicide layer 20 have relatively high reflectivity in the DUV range. Unwanted reflection from the poly layers 14 and the tungsten silicide layer 20 tends to expose masked regions of a later deposited DUV photoresist, causing notching or pitting of the photoresist. Accordingly, an anti-reflective coating (ARC) is provided to prevent unwanted reflection of DUV rays during subsequent lithography steps. Particularly, an ARC 24 is deposited on tungsten silicide layer 20, to minimize reflection from the already deposited layers from DUV rays. To effect deposition of the ARC 24, an adhesive poly 22 is provided. Preferably, ARC 24 is formed of silicon-rich silicon nitride (non-stoichiometric silicon nitride), and has a thickness on the order of 230–250 angstroms. Silicon-rich silicon nitride is particularly adapted to reduce or attenuate unwanted reflection of DUV rays from the underlying poly and metal containing layers during subsequent lithographic processing steps. The ARC 24 is formed by combining dichlorosilane ($SiCl_2H_2$) and ammonia ($NH_3$) at a ratio above 3:1 to form silicon-rich silicon nitride in an LPCVD process.

Thereafter, a stoichiometric silicon nitride ($Si_3N_4$) layer 26 is deposited on ARC 24. Silicon nitride layer 26 is provided as a dielectric layer to isolate the conductive gate electrode 21 from subsequently deposited layers. In prior semiconductors devices, such as SRAMs, other dielectric materials including oxides such as TEOS silicon dioxide have been utilized. However, during later processing steps, an oxide etch is utilized to etch a subsequently formed inter-poly dielectric (IPD) layer to form a contact opening or window, in which a second conductive layer, such as doped poly, is deposited. During the oxide etch, the conventional TEOS silicon dioxide, in addition to the IPD layer, tends to be removed. Accordingly, the dielectric TEOS silicon dioxide has to be made relatively thick (on the order of 2000 angstroms) to provide a margin for etching, which undesirably increases the stack height of the gate stack, and limits the device minimum dimensions (e.g., 0.45 micron). Accordingly, a significantly thinner layer of silicon nitride replaces the dielectric TEOS silicon dioxide according to the present invention. The silicon nitride has a thickness in a range of about 500 to 1500 angstroms, referably about 700 to 1200 angstroms, more preferably about 800 to 1000 angstroms.

After the structure shown in FIG. 2 is fabricated, the present inventors attempted to mask the structure by utilizing a DUV mask for subsequent etching of material to leave a gate. However, it was discovered that numerous problems surfaced when attempting to expose and develop a DUV photoresist, including those commonly available such as APEX, and perhaps others such as JSRK2G. Particularly, it was discovered that after deposition by a spin-on technology to a thickness on the order of 8300 angstroms, the DUV photoresist suffered from quite severe lifting upon exposure and developing. The extent of this lifting is shown in FIGS. 13 and 14, which represent SEM micrographs taken of the surface of the semiconductor die after photoresist exposure and develop. As shown, DUV photoresist 30 included undamaged portions 30a and damaged portions 30b. In FIG. 13, damaged portions 30b lifted from the silicon nitride layer 26, but stayed attached to undamaged portions 30a, while in FIG. 14, damaged portions 30b were completely lost. This lifting phenomenon was found to have a severe impact upon defectivity and yield of the semiconductor devices. Accordingly, the present invention has been developed to address the foregoing problems as discovered by the present inventors.

Skilled artisans may appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

In an attempt to overcome the deficiencies associated with use of DUV lithography on nitride, particularly silicon nitride, the inventors investigated possible mechanisms responsible for the poor adherence and lifting of the photoresist. Particularly, the present inventors first utilized an $O_2$ ash treatment combined with a piranha pretreatment step in an attempt to modify the surface of the silicon nitride to promote adhesion between the silicon nitride and the DUV photoresist. As is known in the art, piranha pretreatment consists of providing a bath of sulfuric acid ($H_2SO_4$) mixed with hydrogen peroxide and deionized water (at an approximate ratio of 1:1:4). Even after extended piranha pretreatments combined with the $O_2$ ash treatment, some increase in adhesion was noted. However, the $O_2$ ash treatment combined with the piranha pretreatment was not sufficient to adequately reduce the lifting phenomenon, and still resulted in relatively poor yield and high defectivity.

Figure 1:
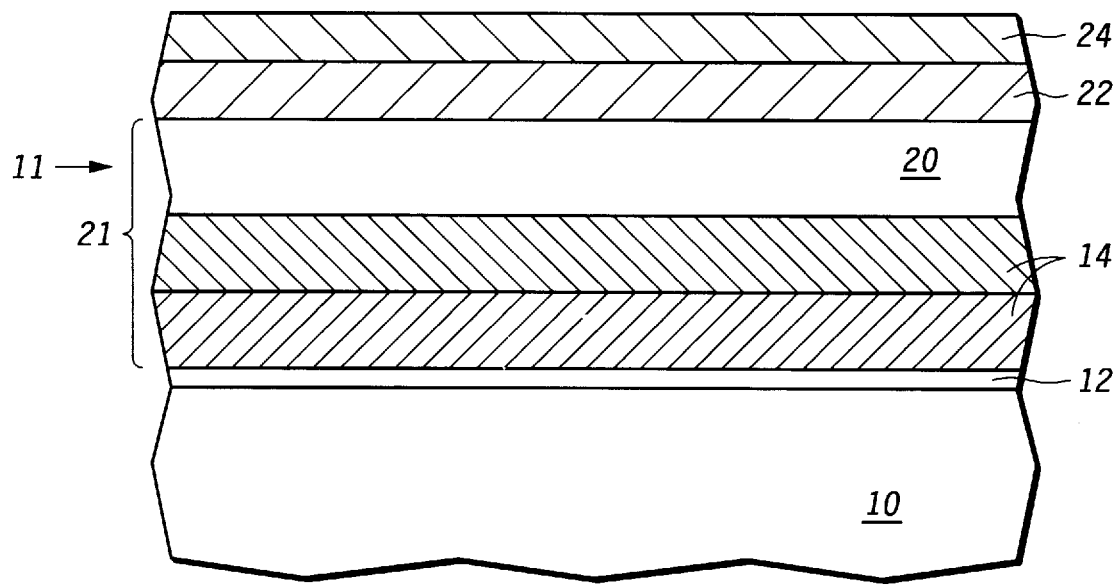
FIG. 1 represents a step in the process of forming a semiconductor device, particularly, a gate stack prior to etching.
Figure 2:
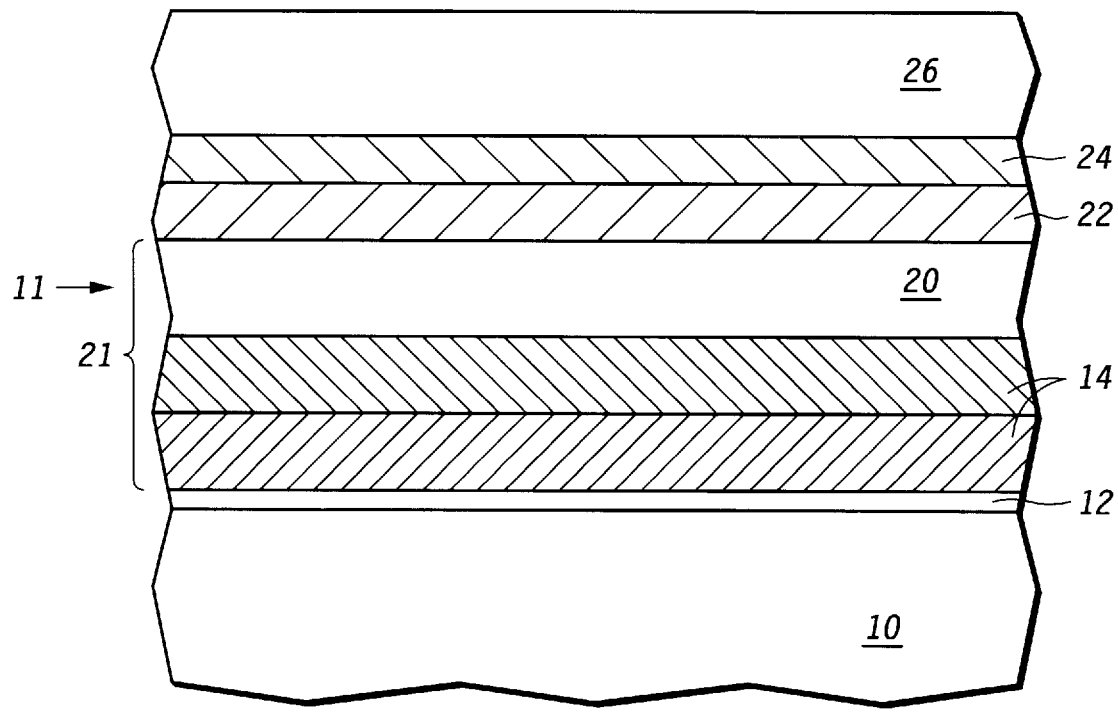
FIG. 2 represents a further step in which stoichiometric silicon nitride is deposited on an ARC, prior to etching.
Figure 3:
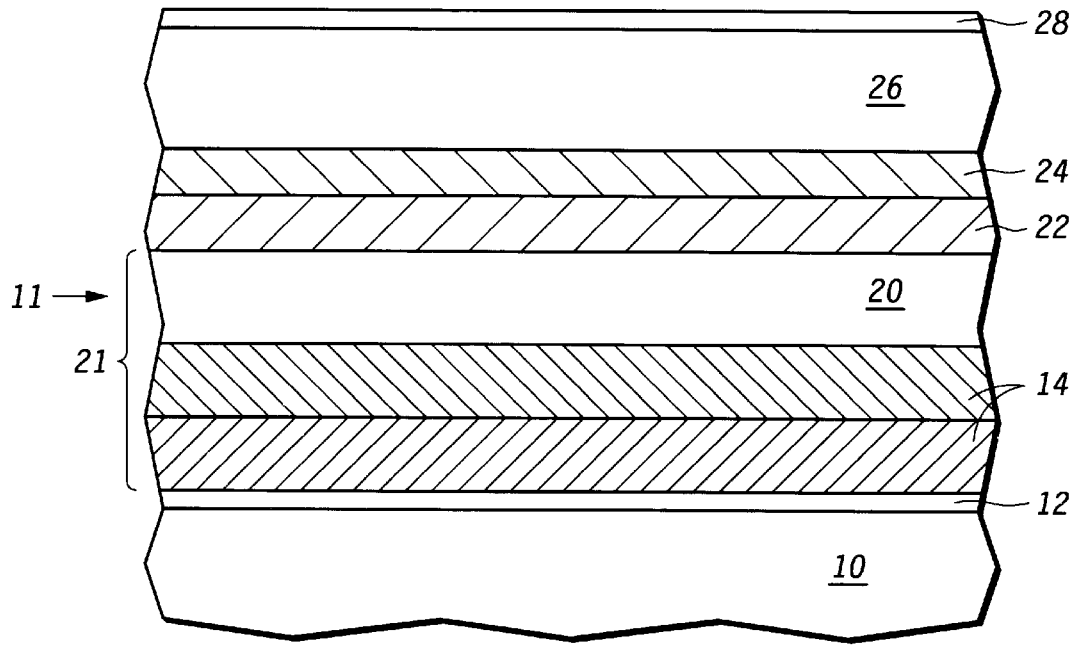
FIG. 3 represents a further step of forming the gate stack prior to etching, wherein an adhesive oxide layer is provided on the silicon nitride layer depicted in FIG. 2.

Based upon the problems of lifting and the foregoing attempts at addressing this problem, the inventors developed a modified process for forming the gate stack, wherein an adhesive oxide layer, particularly, silicon dioxide, is deposited on the silicon nitride layer to provide for adhesion between the silicon nitride layer and the photoresist. In reference to FIG. 3, the adhesive oxide layer is provided by a TEOS $SiO_2$ layer 28 that is deposited directly on the stoichiometric silicon nitride layer 26. Although the adhesive oxide layer was formed by decomposing TEOS, silicon dioxide can be formed by other known methods, such as by plasma enhanced CVD or thermal treatment. Unlike prior semiconductor devices that utilize silicon dioxide as a dielectric over the gate electrode, the TEOS $SiO_2$ layer 28 is quite thin, 30 to 150 angstroms, preferably 30 to 100 angstroms, more preferably 50 to 75 angstroms in thickness. Accordingly, the TEOS layer $SiO_2$ 28 does not appreciably increase the stack height of the gate stack, and permits further miniaturization of the semiconductor devices, beyond the 0.45 micron device discussed above.

Figure 4:
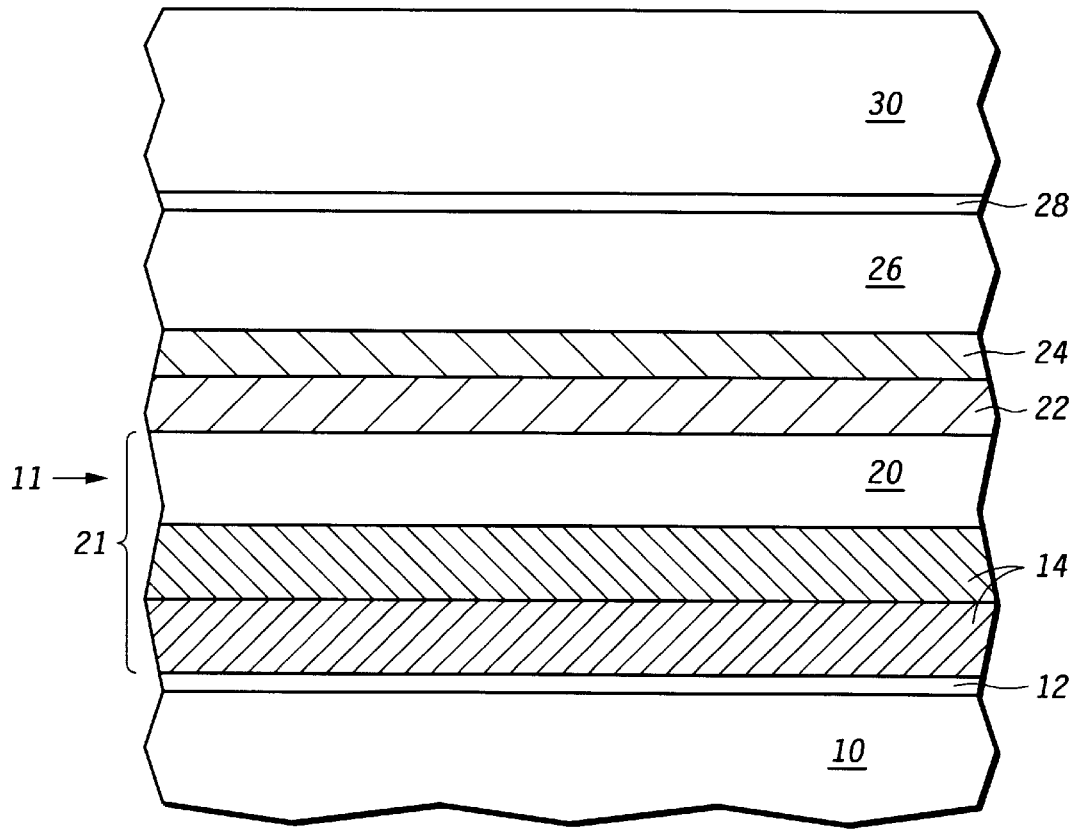
FIGS. 4–6 represent steps of forming a photoresist on the oxide layer, exposing the photoresist, and etching away material.
Figure 5:
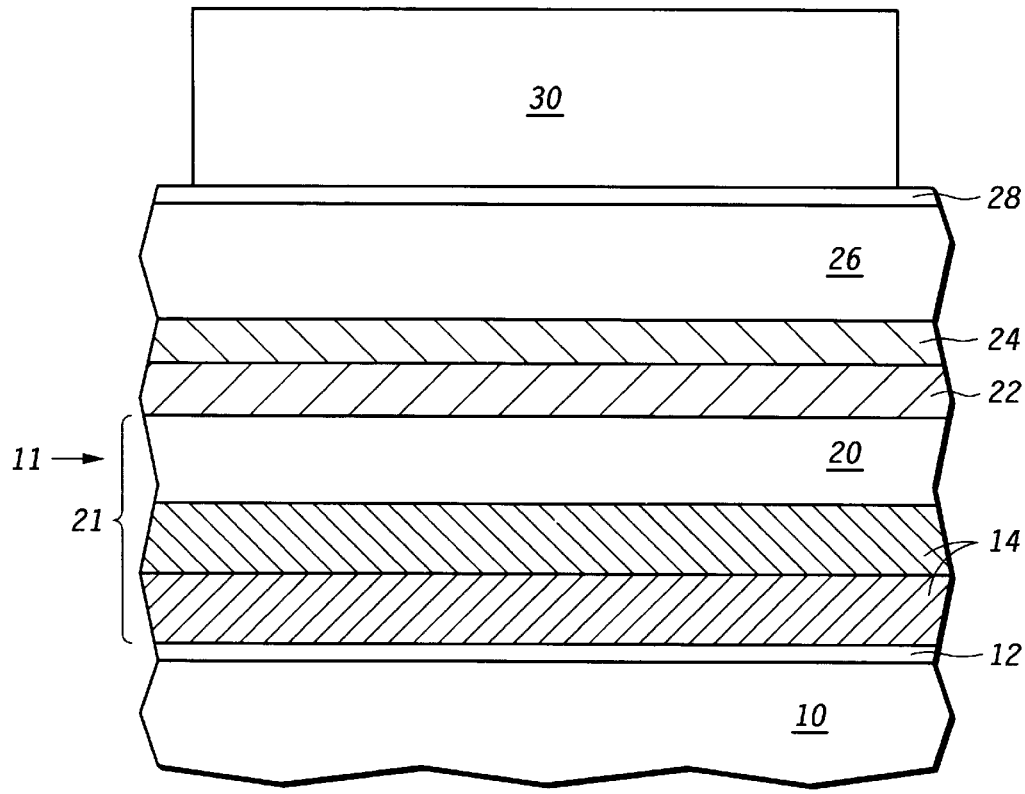
Figure 6:
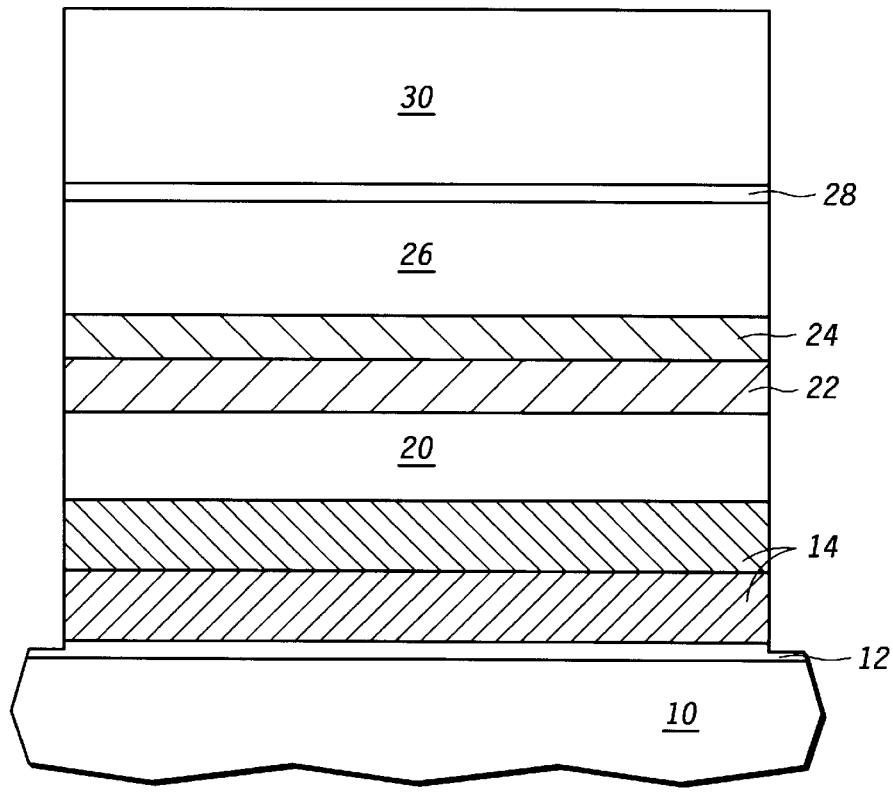
Figure 7:
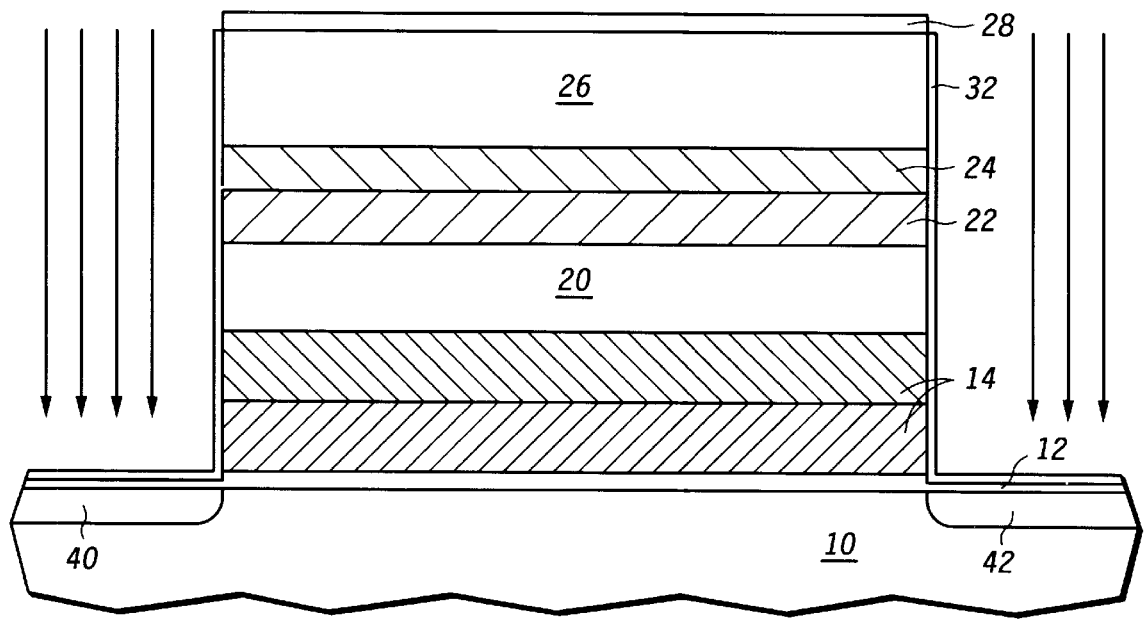
FIG. 7 represents implanting the substrate through a screen oxide layer to form lightly doped regions.
Figure 8:
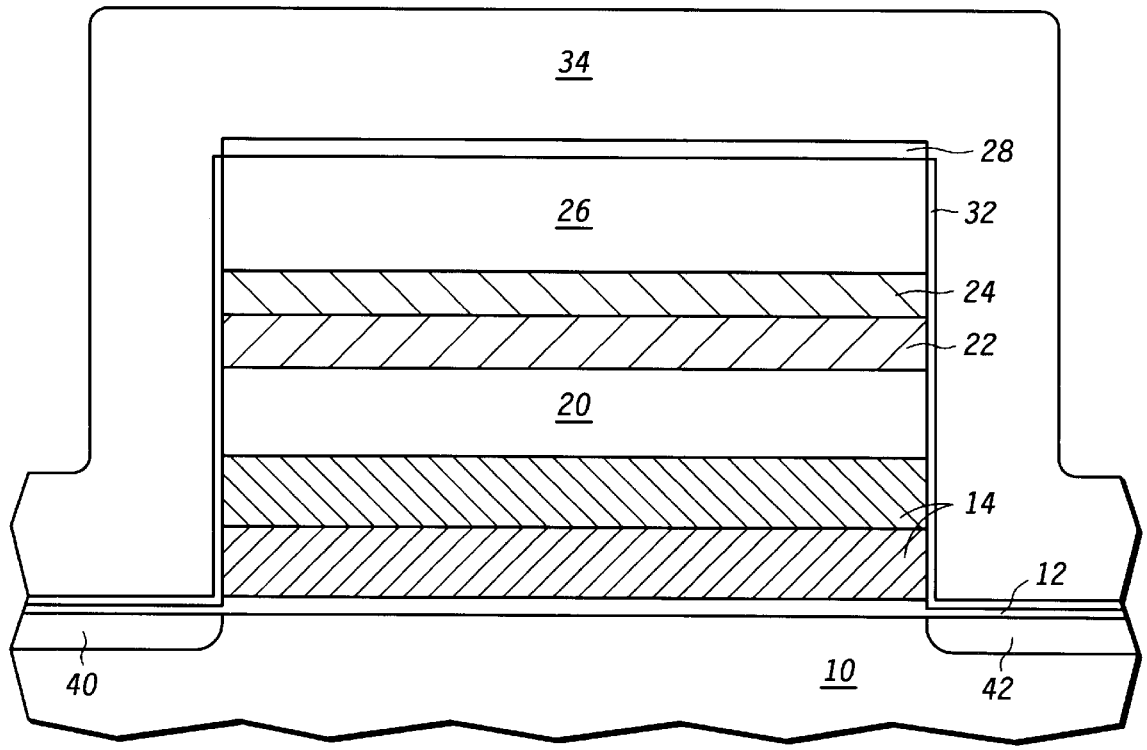
FIG. 8 represents a step of forming a spacer layer extending over the gate stack and regions of the silicon substrate.
Figure 9:
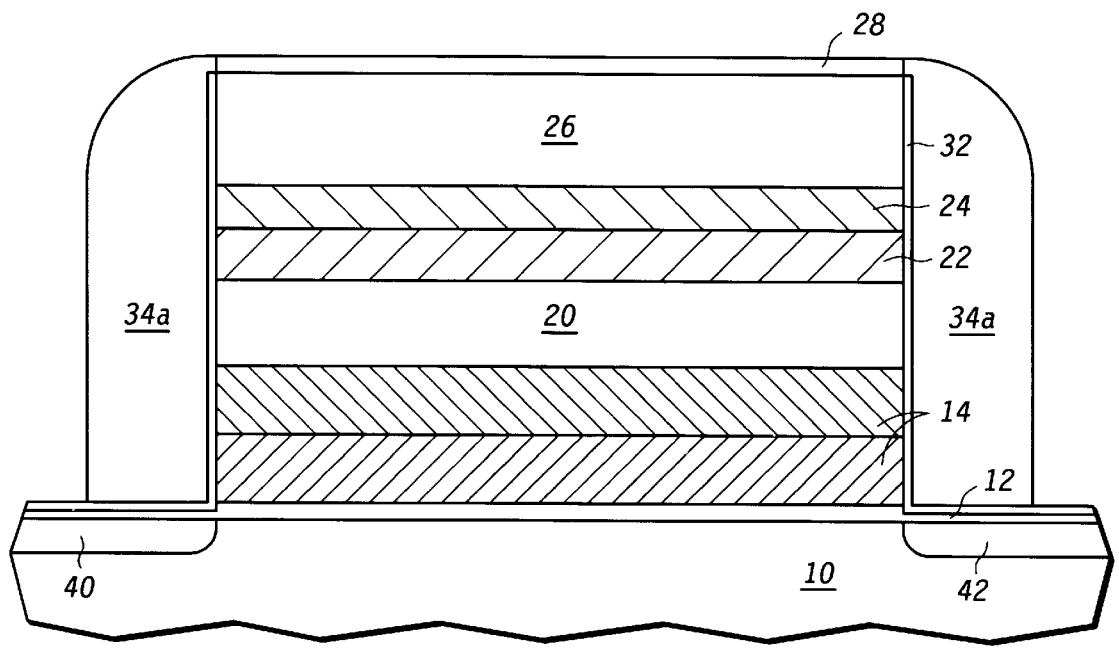
FIG. 9 represents the gate stack after etching the spacer layer to form spacers, followed by an N- anneal step to anneal the lightly doped regions and to form a screen oxide layer.

Then, as shown in FIGS. 4–6, DUV photoresist 30 is spin-coated onto the TEOS $SiO_2$ layer 28, which is then exposed and developed. The layered structure is then etched to leave a gate stack structure as shown in FIG. 6. Thereafter, the semiconductor device is subjected to additional processing steps as are known in the art. Particularly, the DUV photoresist 30 is removed, a thin screen oxide layer 32 is formed, followed by an implant step which sets the light dopant concentration in regions 40 and 42, as shown in FIG. 7. The thin screen oxide layer 32 provides a buffer zone to prevent contamination and non-uniform dopant distribution during the implant step. A silicon nitride spacer layer 34 is then coated on the structure as shown in FIG. 8 by conventional techniques. The silicon nitride spacer layer is then etched to leave spacers 34a, as shown in FIG. 9. Thereafter, the structure is subjected to an N- anneal to recrystalize the source and drain regions to a single crystal form, as depicted in FIG. 9.

Figure 10:
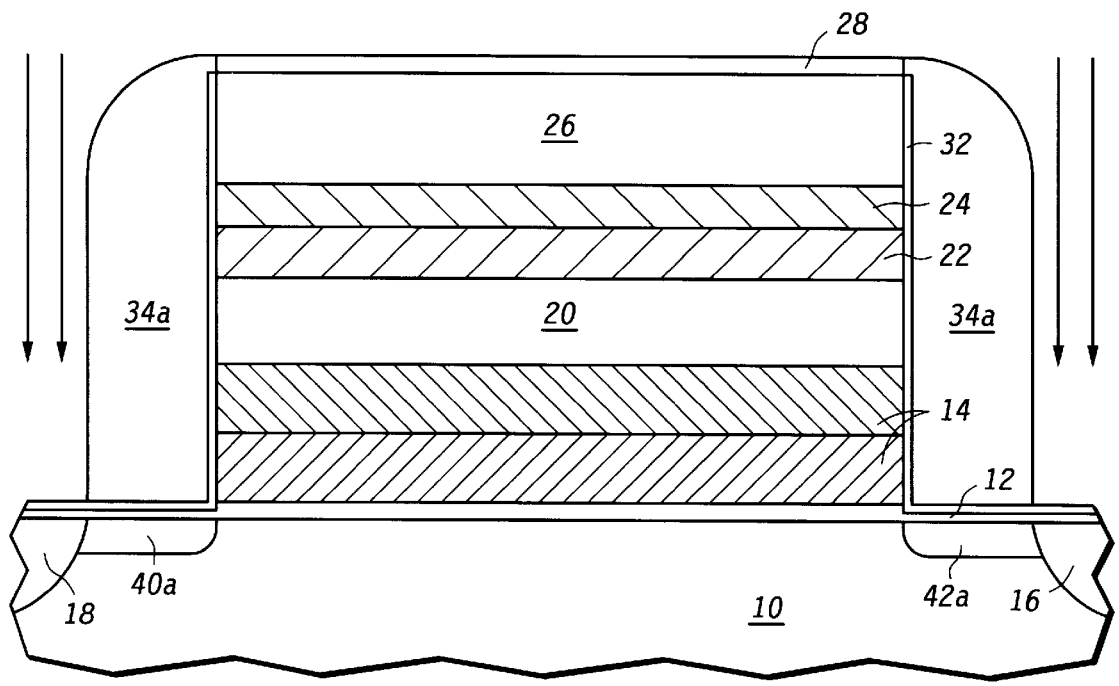
FIG. 10 represents source/drain implant into the substrate to form source and drain regions, thereby leaving lightly doped drain (LDD) regions masked by the spacers.
Figure 11:
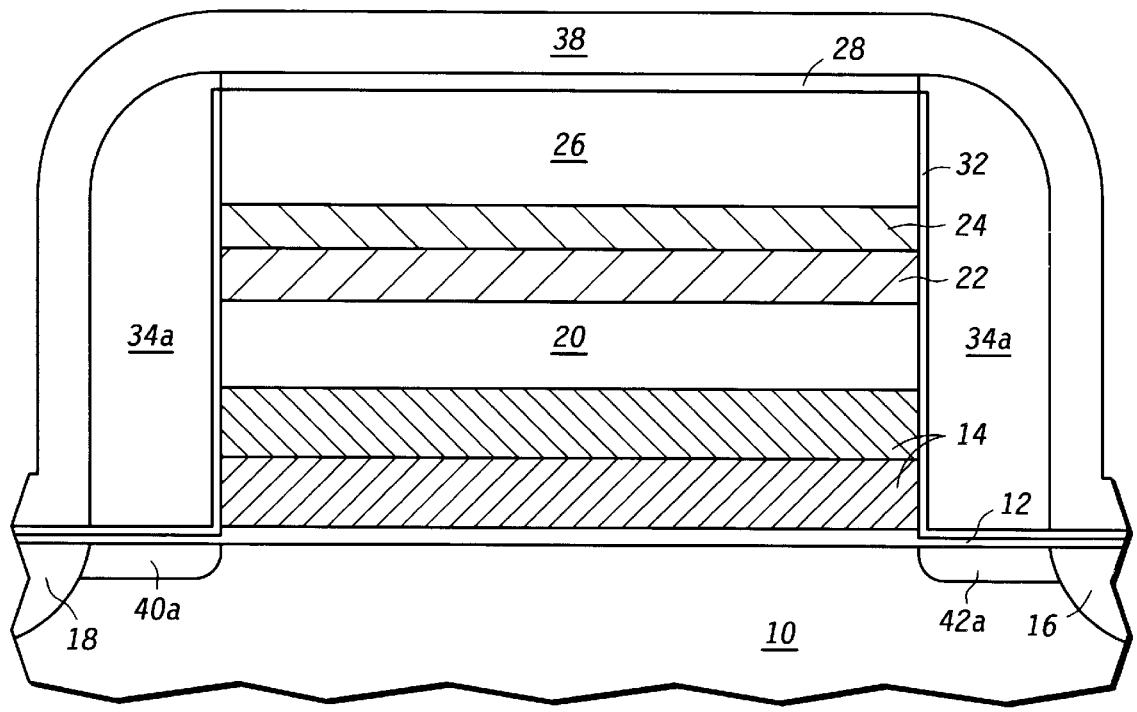
FIG. 11 represents a step of forming an inter poly dielectric (IPD) layer.
Figure 12:
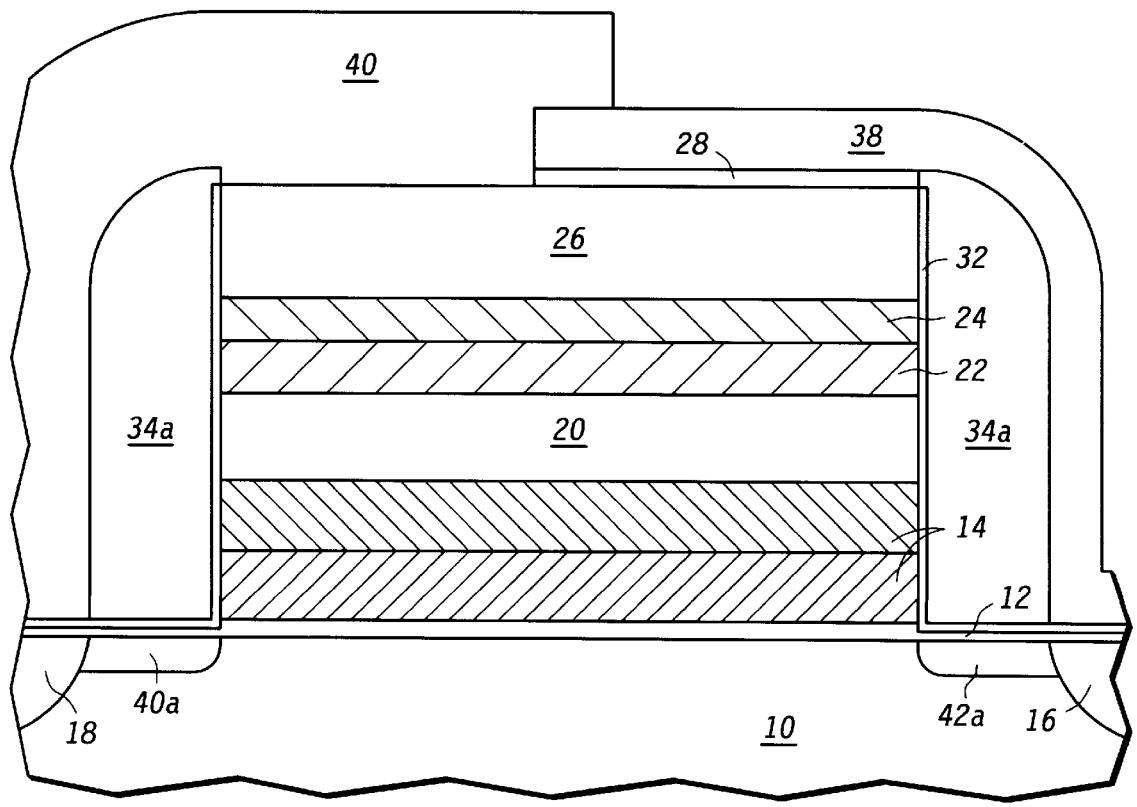
FIG. 12 represents the completed gate stack with a deposited window poly connected to the source region.
Figure 13:
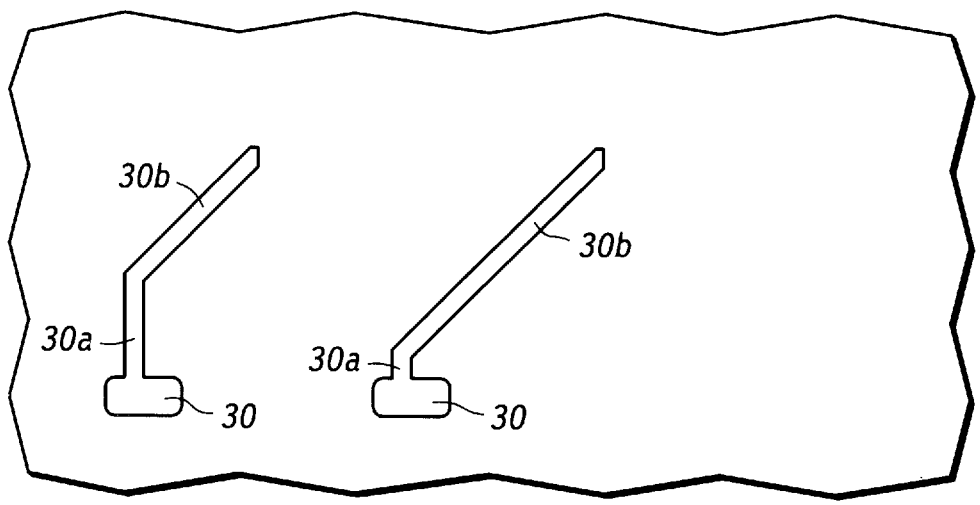
FIGS. 13 and 14 represent the lifting phenomenon of DUV photoresist deposited on silicon nitride.
Figure 14:
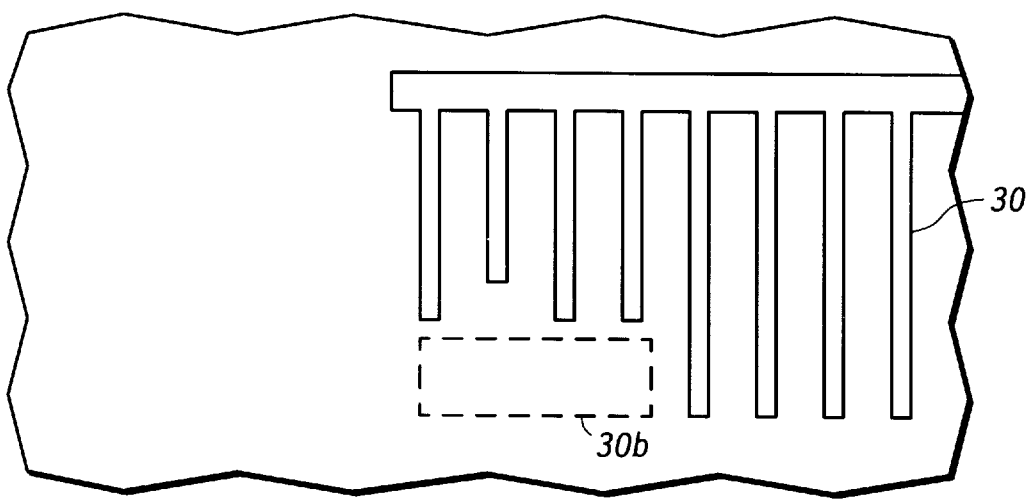

As shown in FIG. 10, the semiconductor device is subjected to a source/drain implant to form self-aligned source and drain regions 18 and 16, respectively. Due to the masking effect of the spacers 34a, lightly doped drains 40a and 42a are formed from portions of regions 40 and 42. An inter-poly dielectric (IPD) layer 38 is then deposited so as to extend over the gate stack and drain region, as shown in FIG. 11. The IPD layer 38 is generally silicon dioxide, desirably formed by the known technique of decomposing TEOS gas. The IPD layer has a thickness of about 1000 to 3000 angstroms, preferably 1500 to 3000 angstroms, more preferably 1500 to 2000 angstroms. A portion of the IPD layer 38 that extends over the source region 18 is etched away to provide a self-aligned contact region in which a conductive window poly 40 is deposited, as known in the art and shown in FIG. 12. The window poly has a thickness on the order of 1500 angstroms.

As provided in the foregoing description, formation of the gate stack containing a stoichiometric silicon nitride layer was modified by incorporating an adhesive oxide layer between the photoresist and the stoichiometric silicon nitride layer. The inventors have indeed confirmed that the present process is responsible for a marked decrease in defectivity. According to the present process, the inventors have been successful in reducing the defectivity. In particular, the present invention provides an increase in yield of die per wafer from 83%, based upon formation of the photoresist directly on stoichiometric silicon nitride, to 100% according to the present invention.

While the present invention has been described with detail regarding particular embodiments herein, it is to be understood that those of ordinary skill in the art may modify the invention as described herein without departing from the spirit and scope of the claims that follow. For example, the dielectric formed by stoichiometric silicon nitride layer may be modified by making a composite layer, including lower oxide, middle nitride, and upper oxide sub-layers, known in the art as an ONO stack. According to this structure, the lower oxide and middle nitride (e.g., silicon nitride) sub-layers are effective to decrease further the stack height. The upper oxide layer would provide the requisite photoresist adhesion to resist lift-off. Additionally, the present invention may be applied to a gate stack having a non-stoichiometric silicon nitride layer, such as a silicon-rich silicon nitride ARC layer in a logic device. Further, the invention is not limited to gate stack application, but also may be applied to other nitride layers in a semiconductor device. For example, the adhesive oxide may be provided on titanium nitride for enhancing adhesion of a photoresist thereto. A titanium nitride skin layer can be found on an exposed top surface of the window poly (i.e., bitline contact poly), which may in turn be masked and etched.

We claim:

1. A method of forming a semiconductor device comprising the steps of:

providing a silicon substrate;

forming a gate stack on the silicon substrate comprising the steps of:

forming a gate electrode on the silicon substrate;

forming a silicon nitride layer on the gate electrode; and forming an adhesive oxide layer on the silicon nitride layer;

forming a DUV photoresist on the gate stack;

exposing the DUV photoresist to DUV energy and developing the DUV photoresist to remove portions thereof to leave exposed regions of the gate stack; and etching the exposed regions of the gate stack.

2. The method of claim 1, wherein the gate electrode comprises at least one polycrystalline silicon layer.

3. The method of claim 2, wherein the at least one polycrystalline silicon layer comprises first and second polycrystalline silicon layers.

4. The method of claim 1, further comprising the step of depositing an antireflective coating on the gate electrode.

5. The method of claim 4, wherein the antireflective coating comprises silicon-rich silicon nitride.

6. The method of claim 1, further comprising the step of depositing a gate oxide layer overlying the silicon substrate, on which the gate stack is provided.

7. The method of claim 6, wherein the gate electrode is formed by providing a polycrystalline silicon layer and depositing a metal-containing layer on the polycrystalline silicon layer.

8. The method of claim 7, wherein the metal-containing layer comprises tungsten silicide.

9. The method of claim 7, wherein the metal-containing layer comprises titanium silicide.

10. The method of claim 1, wherein the adhesive oxide layer comprises silicon dioxide.

11. The method of claim 10, wherein the silicon dioxide is formed by decomposing TEOS.

12. The method of claim 1, wherein the silicon nitride layer comprises stoichiometric silicon nitride.

13. The method of claim 1, wherein the adhesive oxide layer has a thickness within a range of about 30–150 angstroms.

14. The method of claim 13, wherein the adhesive oxide layer has a thickness within a range of about 30–100 angstroms.

15. The method of claim 14, wherein the adhesive oxide layer has a thickness within a range of about 50–75 angstroms.

16. A method for etching a material comprising the steps of:

forming an adhesive oxide layer on the material having a nitride surface, such that the adhesive oxide layer covers the nitride surface;

forming a DUV photoresist on the adhesive oxide layer;

exposing portions of the DUV photoresist;

developing the DUV photoresist to remove the portions of the DUV photoresist and leave exposed regions of the material; and etching the exposed regions of the material.

17. The method of claim 16, wherein the material comprises a nitride.

18. The method of claim 17, wherein the material comprises silicon nitride.

19. The method of claim 16, wherein the material comprises polycrystalline silicon.

20. The method of claim 19, wherein the nitride surface is a skin layer on the polycrystalline silicon.

21. The method of claim 20, wherein the nitride surface comprises titanium nitride.

22. The method of claim 16, wherein the adhesive oxide layer comprises silicon dioxide.

23. The method of claim 22, wherein the silicon dioxide is formed by decomposing TEOS.

* * * * *